(12) United States Patent
Aridome

(10) Patent No.: US 7,945,402 B2
(45) Date of Patent: May 17, 2011

(54) MONITORING APPARATUS FOR SECONDARY BATTERY

(75) Inventor: Koji Aridome, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 361 days.

(21) Appl. No.: 12/087,667

(22) PCT Filed: Feb. 2, 2007

(86) PCT No.: PCT/JP2007/052309
§ 371 (c)(1),
(2), (4) Date: Jul. 11, 2008

(87) PCT Pub. No.: WO2007/089047
PCT Pub. Date: Aug. 9, 2007

(65) Prior Publication Data
US 2009/0125256 A1    May 14, 2009

(30) Foreign Application Priority Data
Feb. 3, 2006 (JP) ................................ 2006-026954

(51) Int. Cl.
*G01R 31/36* (2006.01)
*H02J 7/00* (2006.01)

(52) U.S. Cl. ...................................... 702/63; 320/134

(58) Field of Classification Search ................ 702/63, 702/64; 320/106, 134, 136; 429/24
See application file for complete search history.

(56) References Cited

U.S. PATENT DOCUMENTS

| 6,222,348 B1 * | 4/2001 | Sato et al. ................ 320/149 |
| 6,255,803 B1 | 7/2001 | Ishihara et al. |
| 2006/0273802 A1 * | 12/2006 | Murakami et al. ........... 324/434 |

FOREIGN PATENT DOCUMENTS

| JP | A 2001-116811 | 4/2001 |
| JP | A 2003-134675 | 5/2003 |
| JP | A 2004-325263 | 11/2004 |
| JP | A 2005-108543 | 4/2005 |
| JP | A 2005-114401 | 4/2005 |
| JP | A 2005-117765 | 4/2005 |

* cited by examiner

Primary Examiner — Bryan Bui
(74) Attorney, Agent, or Firm — Oliff & Berridge, PLC

(57) ABSTRACT

When the number of battery cells of a certain battery block is different from a reference number of cells, the inter-terminal voltage of the battery block is converted into the voltage corresponding to the reference number of cells. Thus, even when a plurality of battery blocks being different in the number of battery cells are included, a map for calculating the SOC may only be one. That is, since conventional software or calculation methods can be used, it is not necessary to increase the capacity of SOC calculation software or allowable battery output calculation software. As a result, a plurality of assembled batteries being different in the number of battery cells constituting each battery block can appropriately be monitored.

8 Claims, 8 Drawing Sheets

| T | 1 | 2 | 3 | 4 | 5 | 6 | 7 | 8 | 9 | 10 |
|---|---|---|---|---|---|---|---|---|---|----|
| ch0 | 1 | 1 | 2 | 4 | 4 | 5 | 6 | 7 | 7 | 8 |
| ch1 | 2 | 3 | 3 | 5 | 6 | 6 | 7 | 8 | 9 | 9 |

US 7,945,402 B2

MONITORING APPARATUS FOR SECONDARY BATTERY

TECHNICAL FIELD

The present invention relates to a monitoring apparatus for a secondary battery, and particularly, to a monitoring apparatus for a secondary battery mounted on a vehicle.

BACKGROUND ART

On hybrid vehicles or electric vehicles attracting attention in recent years, a motor is mounted as a motive power source, and a battery supplying the motor with electric power is mounted. As such a battery mounted on the hybrid or electric vehicles, a secondary battery that can repeatedly be charged and discharged, such as a nickel hydride battery or a lithium ion battery, is used.

The battery mounted on the hybrid or electric vehicles is adapted to high voltages so as to correspond to the increased output of the motor. Generally, the secondary battery is configured as a battery pack formed by a plurality of serially connected battery modules each formed by a plurality of serially connected battery cells.

In many cases, a monitoring apparatus that senses abnormality by monitoring a plurality of cells constituting such a battery pack (assembled battery) is provided along with the assembled battery. For example, an abnormality determining apparatus disclosed in Japanese Patent Laying-Open No. 2005-114401 determines abnormality of an assembled battery based on a value of a voltage sensor provided for each battery module. Based on usage frequency of a plurality of battery modules, the abnormality determining apparatus sets a threshold value for determining abnormality of the battery modules. Therefore, a replaced battery (new battery) is prevented from being erroneously determined as an abnormal battery.

In some cases, a high-voltage secondary battery used for hybrid vehicles or the like is configured so that the number of battery cells constituting a battery module is different among a plurality of battery packs, in consideration of the limited installation space. On the other hand, the aforementioned Japanese Patent Laying-Open No. 2005-114401 does not particularly disclose about whether or not the abnormality determining apparatus can appropriately monitor the secondary battery when there are battery modules being different in the number of battery cells.

DISCLOSURE OF THE INVENTION

An object of the present invention is to provide a monitoring apparatus for a secondary battery that can appropriately monitor a plurality of assembled batteries being different in the number of battery cells constituting each battery module.

In summary, the present invention is a monitoring apparatus for a secondary battery including a plurality of assembled batteries. Each of the plurality of assembled batteries has a plurality of battery blocks. In at least one of the plurality of assembled batteries, number of battery cells constituting each of the plurality of battery blocks is different from a reference number of cells. The monitoring apparatus includes: a voltage detecting circuit detecting an inter-terminal voltage for each of the plurality of battery blocks; and a processing unit calculating a state of charge for each of the plurality of battery blocks, based on the inter-terminal voltage. The processing unit converts the inter-terminal voltage into a voltage per the reference number of cells for a battery block having the battery cells in a number different from the reference number of cells among the plurality of battery blocks, and obtains the state of charge.

Preferably, the monitoring apparatus is shared by the plurality of assembled batteries.

Preferably, the voltage detecting circuit detects the inter-terminal voltage for each of the plurality of battery blocks over the plurality of assembled batteries.

Further preferably, the monitoring apparatus is shared by the plurality of assembled batteries.

Another aspect of the present invention provides a monitoring apparatus for a secondary battery including a plurality of assembled batteries. Each of the plurality of assembled batteries has a plurality of battery blocks. In at least one of the plurality of assembled batteries, number of battery cells constituting each of the plurality of battery blocks is different from a reference number of cells. The monitoring apparatus includes: a voltage detecting circuit detecting a plurality of inter-terminal voltages respectively corresponding to the plurality of battery blocks; and a processing unit performing an abnormality determination of the secondary battery using the plurality of inter-terminal voltages detected by the voltage detecting circuit. The processing unit selects, out of the plurality of inter-terminal voltages, first and second inter-terminal voltages respectively corresponding to, among the plurality of battery blocks, first and second battery blocks being identical in number of the battery cells, and determines abnormality of the secondary battery by using the first and second inter-terminal voltages.

Preferably, the monitoring apparatus is shared by the plurality of assembled batteries.

Preferably, the voltage detecting circuit detects the inter-terminal voltage for each of the plurality of battery blocks over the plurality of assembled batteries.

Further preferably, the monitoring apparatus is shared by the plurality of assembled batteries.

According to the present invention, a plurality of assembled batteries being different in the number of battery cells constituting each battery block can appropriately be monitored.

BEST MODES FOR CARRYING OUT THE INVENTION

Figure 1:
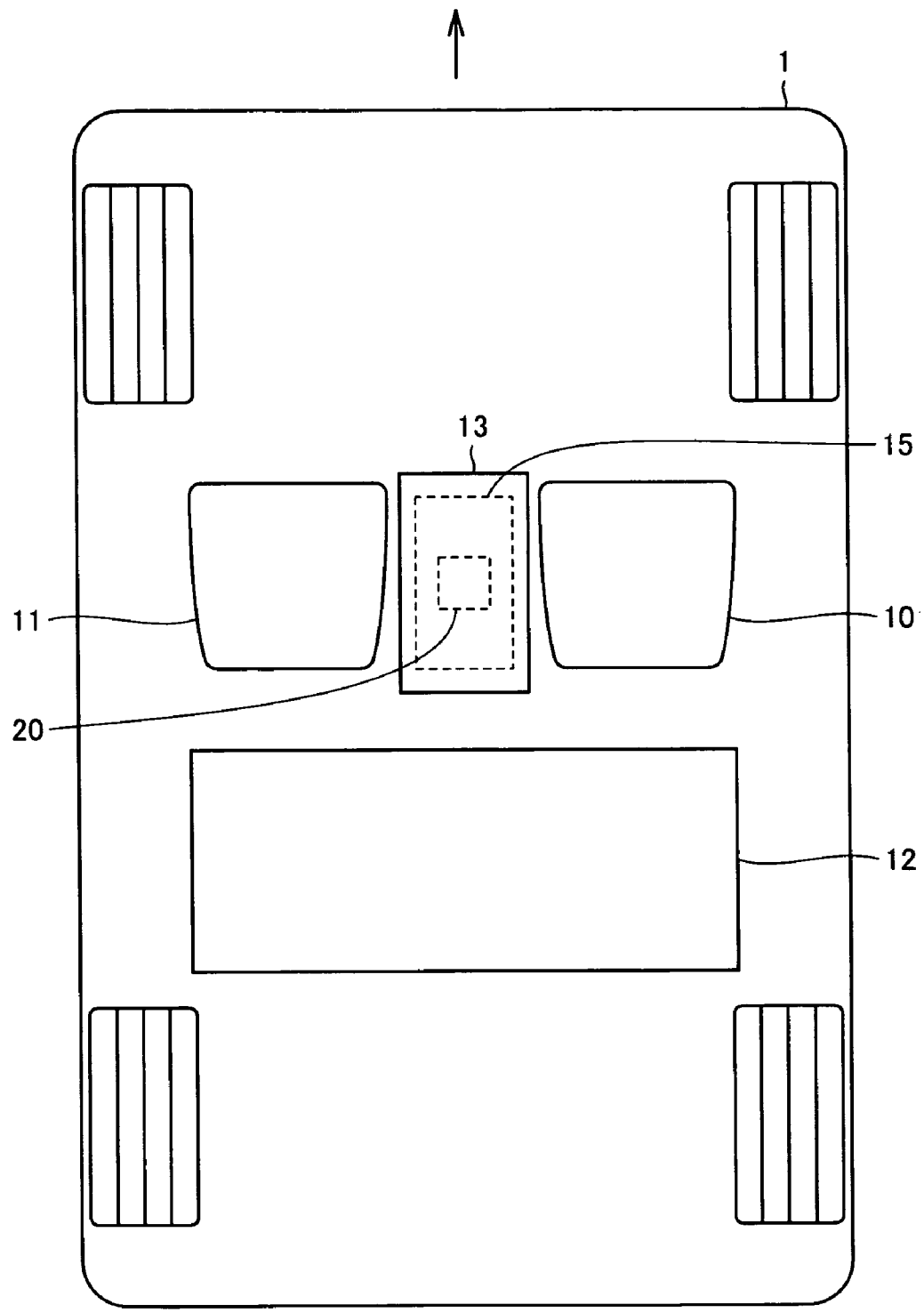
FIG. 1 is a plan view of a vehicle on which a monitoring apparatus for a secondary battery according to a first embodiment is mounted.

In the following, referring to the drawings, embodiments of the present invention are described in detail. Throughout the drawings, the same reference characters denote the same or corresponding parts.

First Embodiment

FIG. 1 is a plan view of a vehicle on which a monitoring apparatus for a secondary battery according to a first embodiment is mounted.

Figure 2:
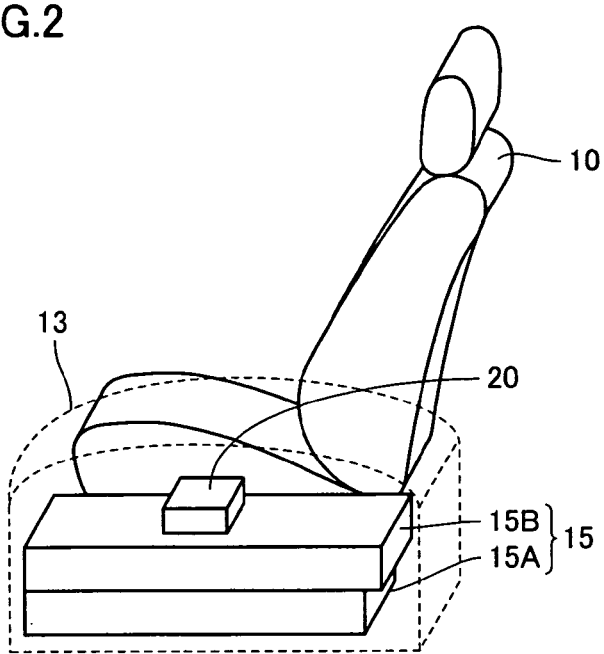
FIG. 2 schematically shows an installed state of a battery 15 in FIG. 1.

FIG. 2 schematically shows an installed state of a battery 15 in FIG. 1.

Referring to FIGS. 1 and 2, a vehicle 1 is a vehicle such as a hybrid vehicle or an electric vehicle, on which a motor (not shown) as a motive power source is mounted. In FIG. 1, the top of the drawing corresponds to the traveling direction of vehicle 1. Vehicle 1 includes a driver's seat 10, a passenger's seat 11, a rear seat 12, a console box 13, a battery 15, and a monitoring apparatus 20. The arrangement of driver's seat 10 and passenger's seat 12 on the right and left sides, respectively, may be switched.

Driver's seat 10 and passenger's seat 11 are arranged with a distance from each other in the vehicle width direction. Between driver's seat 10 and passenger's seat 11, console box 13 having a storage portion, a cup holder and the like (all not shown) is provided. Inside console box 13, a battery 15 being a secondary battery supplying power to the motor, and a monitoring apparatus 20 for battery 15 are stored. Battery 15 includes battery packs 15A, 15B as a plurality of assembled batteries. Monitoring apparatus 20 is box-shaped, and placed on battery pack 15B.

In the present invention, "an assembled battery" means an electrically connected plurality of battery modules being the same in the number of cells. Accordingly, in the present invention, if there are battery modules electrically connected to one another but constituted of different number of cells, such battery modules belong to different assembled batteries.

As the secondary battery mounted on a hybrid or electric vehicle is adapted to high voltage so as to corresponds to the increased output of the motor, a plurality of battery modules are serially connected. For example, when it is intended to define the greatest possible space of the rear seat or that of the luggage room (trunk room), it may not be possible to define the space for storing the secondary battery under the rear seat or the trunk room. Though the portion between driver's seat 10 and passenger's seat 11 is limited widthwise and lengthwise, there is relatively much space left heightwise. Therefore, the secondary battery is mounted for example as shown in FIGS. 1 and 2.

Figure 3:
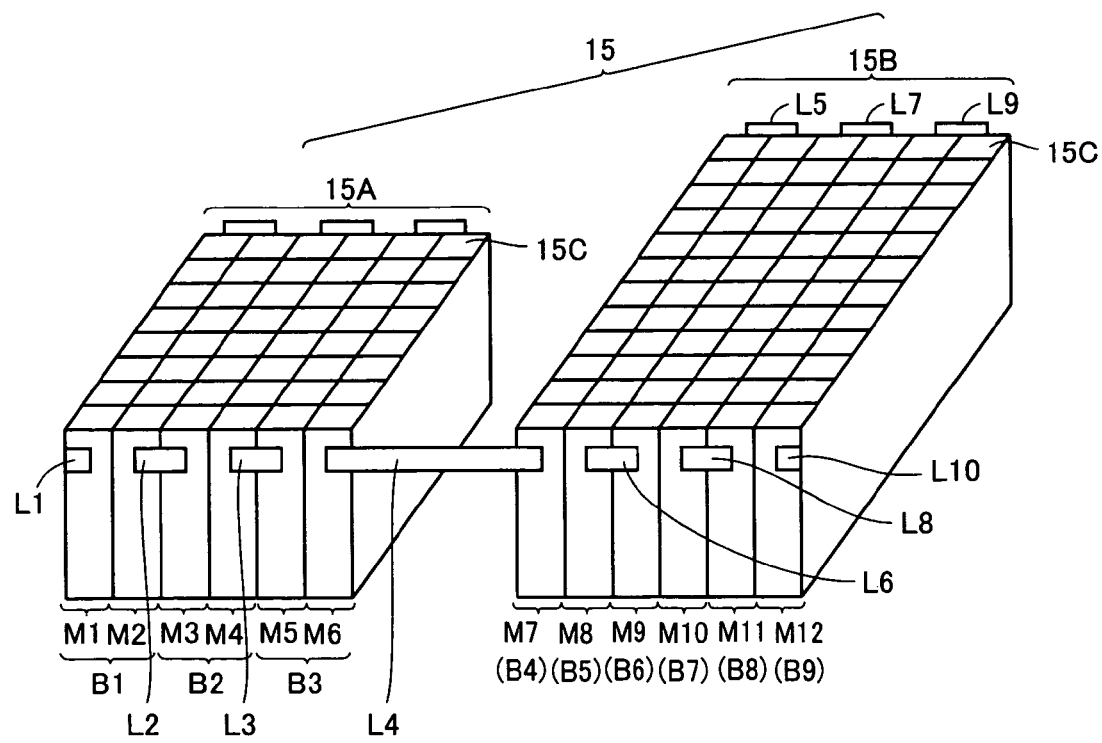
FIG. 3 shows a configuration of battery packs 15A, 15B in FIG. 2 in greater detail.

FIG. 3 shows a configuration of battery packs 15A, 15B in FIG. 2 in greater detail.

Referring to FIG. 3, battery pack 15A includes battery modules M1-M6 electrically connected in series via voltage detection lines L1-L4. Battery modules M1, M2 constitute a battery block B1. Battery modules M3, M4 constitute a battery block B2. Battery modules M5, M6 constitute a battery block B3.

Battery pack 15B includes battery modules M7-M12 electrically connected in series via voltage detection lines L4-L10. Battery module M7 constitutes a battery block B4. Battery module M8 constitutes a battery block B5. Battery module M9 constitutes a battery block B6. Battery module M10 constitutes a battery block B7. Battery module M11 constitutes a battery block B8. Battery module M12 constitutes a battery block B9.

Battery module M6 and battery module M7 are electrically connected in series via voltage detection line L4. On the depth side in the drawing, terminals are provided between battery module M1 and battery module M2, between battery module M3 and battery module M4, and between battery module M5 and battery module M6. Similarly, on the depth side in the drawing, voltage detection lines L5-L9 are respectively provided between battery module M7 and battery module M8, between battery module M9 and battery module M10, and between battery module M11 and battery module M12.

Battery modules M1-M6 each include eight battery cells 15C connected in series. That is, battery blocks B1-B3 each include sixteen battery cells 15C connected in series. Battery modules M7-M12 (battery blocks B4-B9) each include twelve battery cells 15C connected in series. In the following description, the reference value of the number of battery cells 15C included in a battery block (a reference number of cells) is 12.

Figure 4:
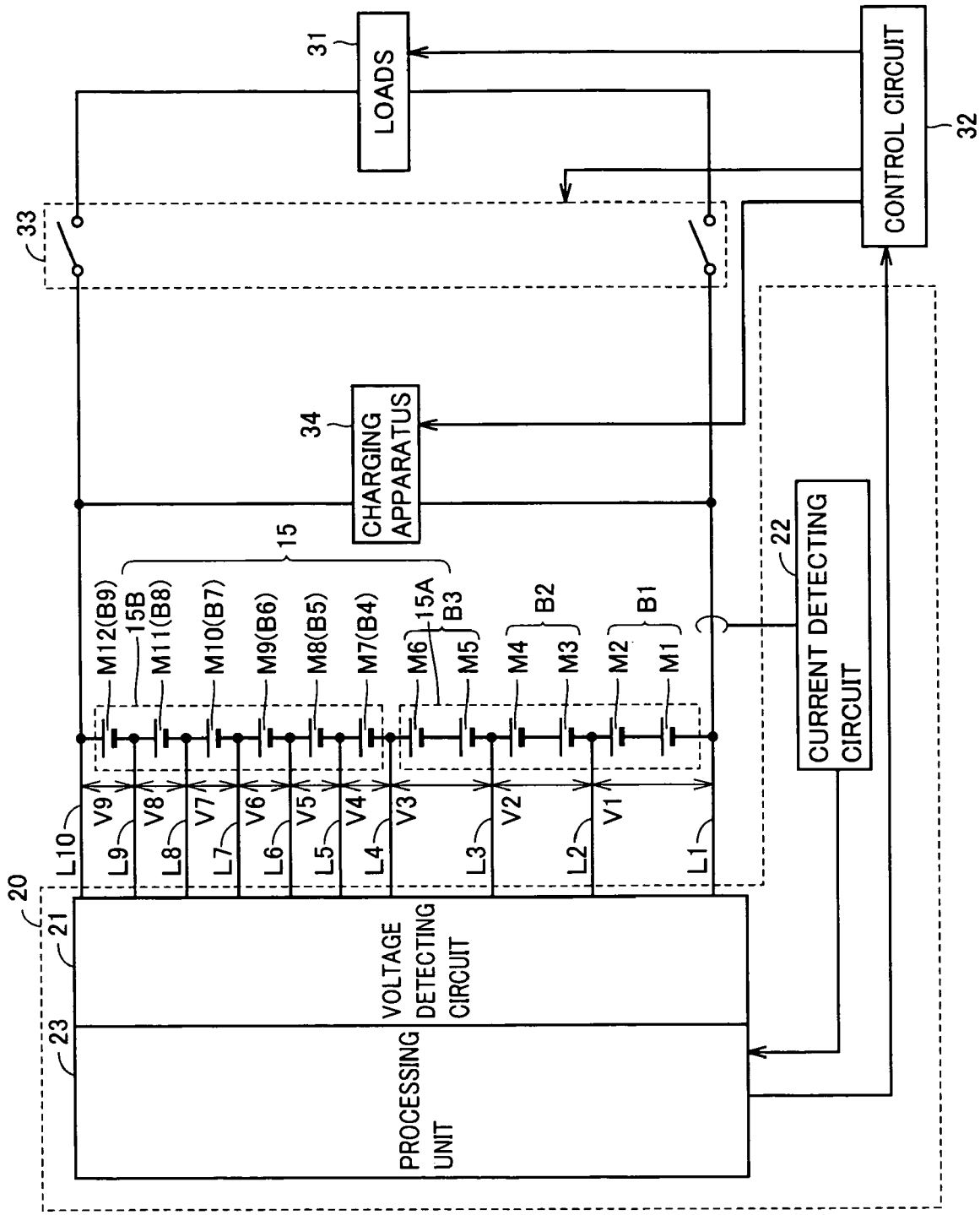
FIG. 4 is a block diagram showing a configuration of a monitoring apparatus 20 in FIG. 1 and peripheral circuitry of monitoring apparatus 20.

FIG. 4 is a block diagram showing a configuration of a monitoring apparatus 20 in FIG. 1 and peripheral circuitry of monitoring apparatus 20.

Referring to FIG. 4, monitoring apparatus 20 includes a voltage detecting circuit 21, a current detecting circuit 22, and a processing unit 23. Voltage detecting circuit 21 detects an inter-terminal voltage for each of a plurality of battery blocks. Processing unit 23 obtains the state of charge for each of the plurality of battery blocks based on each of the inter-terminal voltage. Processing unit 23 converts the inter-terminal voltage into a voltage per reference number of cells and obtains the state of charge, for a battery block among the plurality of battery blocks which has the battery cells in the number different from the reference number of cells.

More specifically, voltage detecting circuit 21 detects inter-terminal voltages V1-V9 of battery blocks B1-B9, respectively. Current detecting circuit 22 detects a charging/discharging current of battery 15. Processing unit 23 obtains voltage values of inter-terminal voltages V1-V9 from voltage detecting circuit 21. Processing unit 23 obtains a current value from current detecting circuit 22. Based on these values, processing unit 23 obtains the state of charge (SOC, also referred to as a remaining capacity or charged amount), or detects abnormality of battery 15.

It is to be noted that, as shown in FIG. 4, voltage detecting circuit 21 detects the inter-terminal voltage for each of the plurality of battery blocks, over battery packs 15A, 15B. Monitoring apparatus 20 is shared by battery packs 15A, 15B.

Battery 15 supplies power to various loads 31 mounted on the vehicle. Loads 31 are configured by an inverter, a motor and the like, and convert direct-current power from battery 15 into alternating-current power by the inverter and drive the motor. Control circuit 32 controls the operation of loads 31 based on an SOC value received from processing unit 23 or the like, and controls a charging apparatus 34 for charging battery 15. When processing unit 23 senses abnormality of battery 15, processing unit 23 outputs a signal indicative of abnormality sensing to control circuit 32. In response to the signal, control circuit 32 shuts off a relay 33, thereby shutting off the power supply to the loads.

Figure 5:
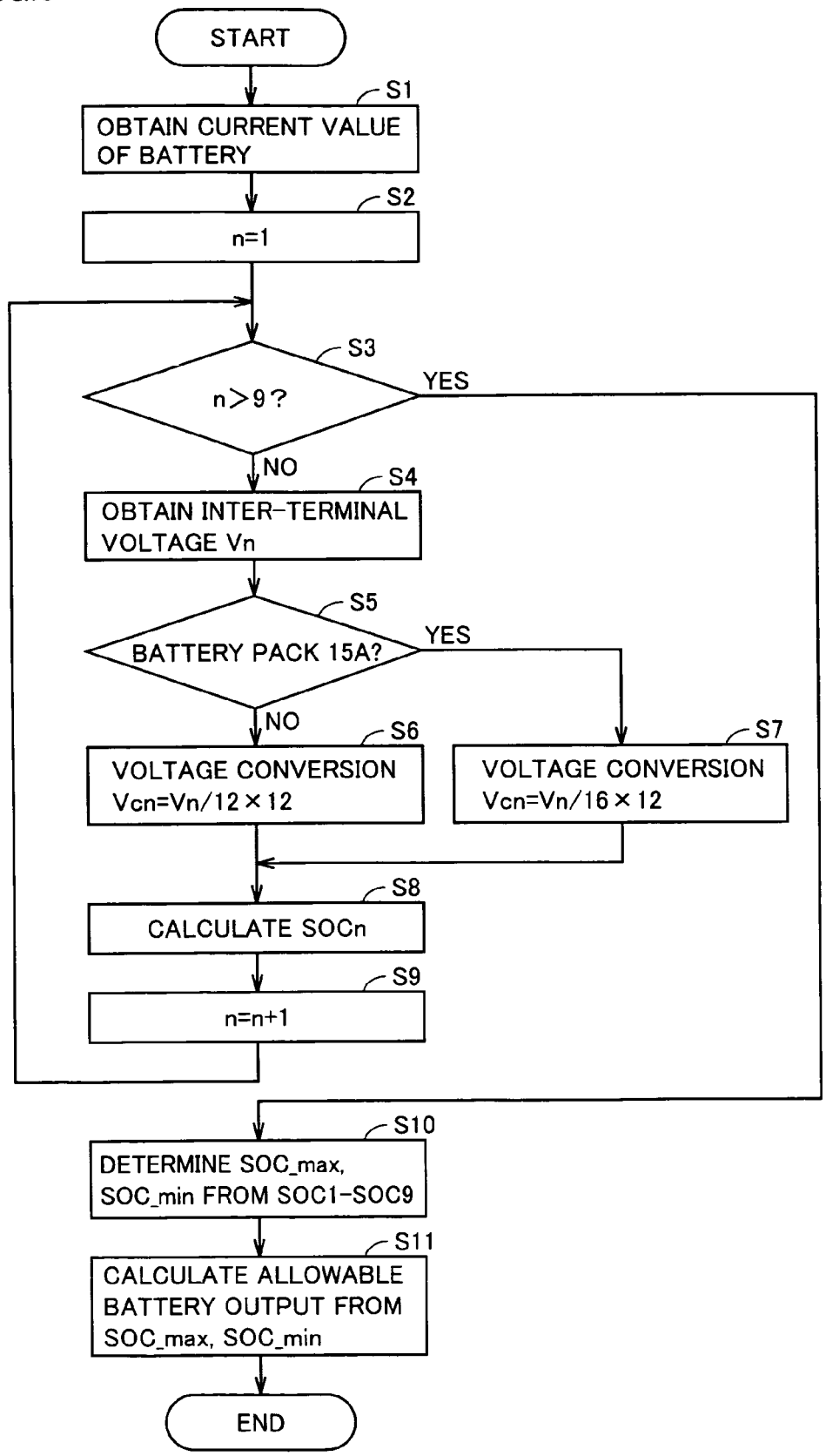
FIG. 5 is a flowchart describing processing at processing unit 23 in the monitoring apparatus of the first embodiment.

FIG. 5 is a flowchart describing processing at processing unit 23 in the monitoring apparatus of the first embodiment.

Referring to FIGS. 4 and 5, when the processing is started, firstly in step S1, processing unit 23 instructs current detecting circuit 22 to detect current passing through battery 15.

Then, processing unit 23 obtains the current value of battery 15 from current detecting circuit 22. Next, in step S2, processing unit 23 sets the value of variable n to 1.

Next, in step S3, processing unit 23 determines whether or not variable n is greater than 9. When variable n is not greater than 9 (NO in step S3), processing unit 23 executes the process of step S4.

In step S4, processing unit 23 instructs voltage detecting circuit 21 to detect an inter-terminal voltage Vn of a battery block Bn. Then, processing unit 23 obtains a value of inter-terminal voltage Vn from voltage detecting circuit 21.

Subsequently, in step S5, based on the value of variable n, processing unit 23 determines whether or not battery block Bn belongs to battery pack 15A. When variable n is $1 \leq n \leq 3$, processing unit 23 determines that inter-terminal voltage Vn is the voltage of the battery block that belongs to battery pack 15A (YES in step S5). On the other hand, when variable n is $4 \leq n \leq 9$, processing unit 23 determines that inter-terminal voltage Vn is the voltage of the battery block that belongs to battery pack 15B (NO in step S5).

When NO in step S5, in step S6, processing unit 23 converts inter-terminal voltage Vn into a voltage per reference number of cells (12 cells). In this case, voltage Vcn after conversion is Vcn=Vn/12×12.

On the other hand, when YES in step S5, in step S7, processing unit 23 converts inter-terminal voltage Vn into a voltage per reference number of cells (12 cells). In this case, voltage Vcn after conversion is Vcn=Vn/16×12.

When the process in step S6 or step S7 ends, the processing proceeds to step S8. In step S8, processing unit 23 obtains state of charge SOCn of battery block Bn using a map.

Figure 6:
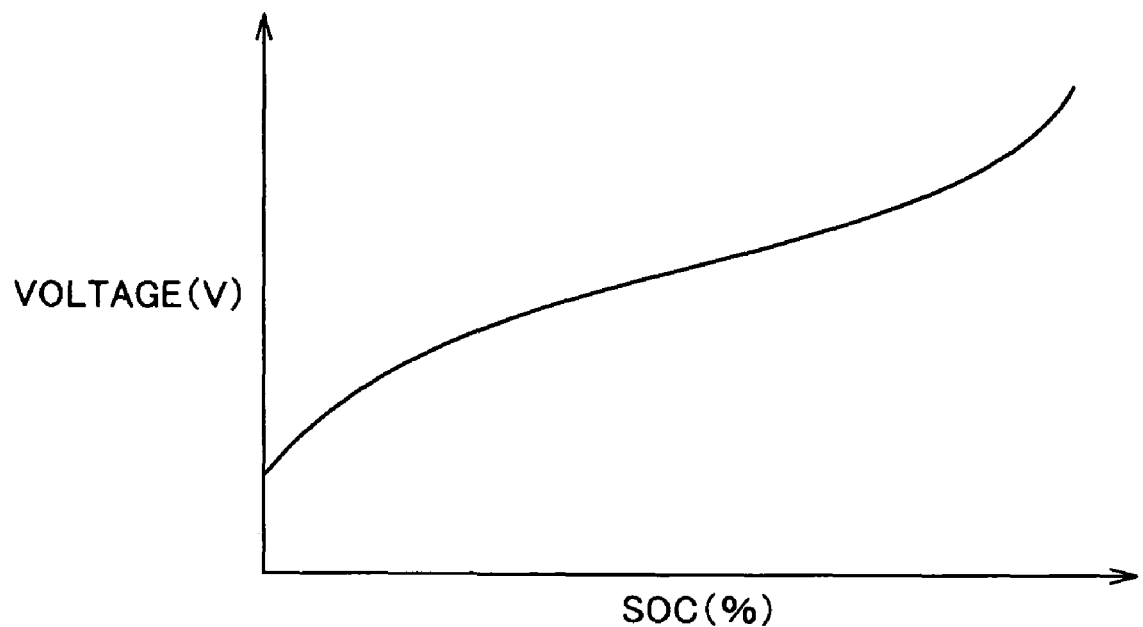
FIG. 6 is an illustration for describing a map used in a process in step S8 in FIG. 5.

FIG. 6 is an illustration for describing a map used in the process in step S8 in FIG. 5.

Referring to FIG. 6, the SOC and the inter-terminal voltage are associated with each other. Using this map, the SOC can be obtained from the inter-terminal voltage. On the other hand, the inter-terminal voltage changes in accordance with charging/discharging current. Accordingly, it is preferable that processing unit 23 estimates the SOC by integrating the charging/discharging current values detected by current detecting circuit 22. As a result, the SOC can be estimated more precisely.

Referring to FIG. 5 again, the processing after step S8 is described. In step S9, processing unit 23 increments variable n by 1. After step S9, the processing returns to step S3. In step S3, when variable n is greater than 9 (YES in step S3), the processing goes to step S10. By repeating the processes of steps S3-S9, the state of charge SOC1-SOC9 of battery blocks B1-B9, respectively, can be obtained.

In step S10, processing unit 23 determines the maximum value (SOC_max) and minimum value (SOC_min) among state of charge SOC1-SOC9. In step S11, processing unit 23 uses SOC_max and SOC_min to calculate allowable battery output (allowable charge/discharge amount) of battery 15.

Provided that the performance of battery block B1 is superior to that of battery block B2, the life of battery block B2 may be shortened if battery block B2 is charged/discharged in accordance with battery block B1. In a charging mode, control circuit 32 controls charging apparatus 34 in accordance with SOC_max. In a discharging mode, control circuit 32 controls the operation of loads 31 in accordance with SOC_min. As a result, the loads can be operated while the life of the battery module is prevented from becoming short.

Battery pack 15A can be considered to be configured by four battery blocks connected in series, each formed by twelve cells (16×3/12=4). Accordingly, battery 15 can be considered to be configured by ten (4+6=10) battery blocks connected in series, each formed by twelve cells. The allowable battery output in a discharging mode may be calculated by, for example using a map in which the SOC and the output are associated with each other, multiplying the output corresponding to SOC_min by 10. Similarly, the allowable battery output in a charging mode may be calculated by, using the map, multiplying the output corresponding to SOC_max by 10.

When the allowable battery output is calculated in step S11, the whole processing ends.

In the first embodiment, when the number of battery cells of a certain battery block is different from the reference number of cells, the inter-terminal voltage of the battery block is converted into the voltage corresponding to the reference number of cells (step S6 in FIG. 5). As a result, even when a plurality of battery blocks being different in the number of battery cells are included, the map for calculating the SOC may only be one. That is, since conventional software or calculation methods can be used, it is not necessary to increase the capacity of SOC calculation software or allowable battery output calculation software stored in the processing unit. Thus, according to the first embodiment, a plurality of assembled batteries being different in the number of battery cells constituting each battery block can appropriately be monitored.

Second Embodiment

A monitoring apparatus for a secondary battery according to a second embodiment is similarly configured as the one shown in FIG. 4. Accordingly, the configuration of the monitoring apparatus for the secondary battery according to the second embodiment is not repeatedly described.

In the second embodiment, using the inter-terminal voltages of two battery blocks being the same in the number of battery cells, abnormality of the secondary battery is determined. In the following, processing of the monitoring apparatus for the secondary battery according to the second embodiment is described with reference to occurrence of "minor short" as an example of the abnormality of the secondary battery. The term "minor short" refers to the phenomenon of leakage caused by a foreign object mixed in a certain battery cell or the like. When minor short occurs in a certain battery cell, the inter-terminal voltage of the battery block including that particular battery cell becomes lower than the inter-terminal voltage of a normal battery block.

Figure 7:
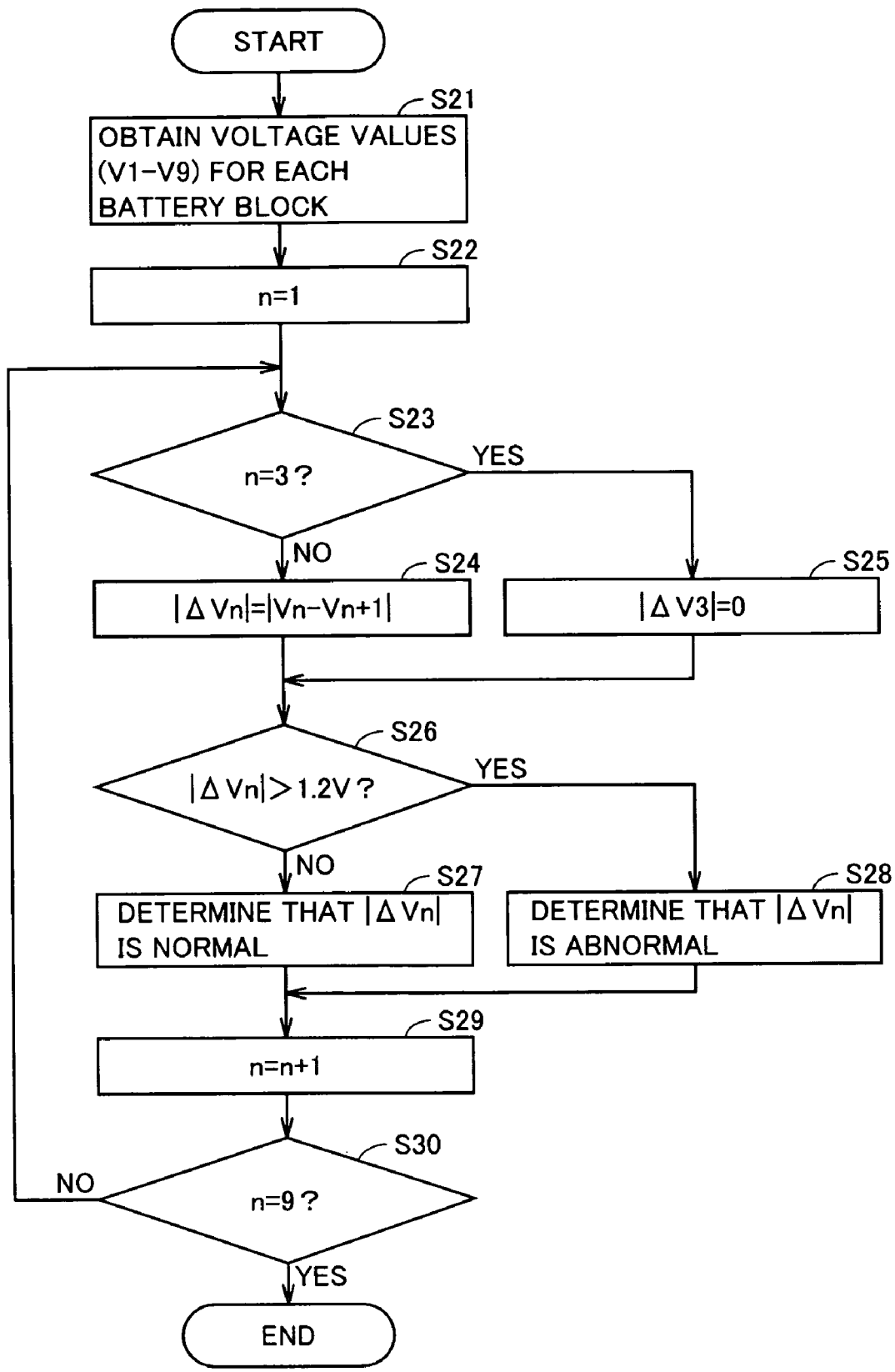
FIG. 7 is a flowchart describing an abnormality detection processing by a monitoring apparatus for a secondary battery according to a second embodiment.

FIG. 7 is a flowchart describing an abnormality detection processing by the monitoring apparatus for the secondary battery according to the second embodiment.

Referring to FIG. 7, when the processing is started, in step S21, voltage detecting circuit 21 detects inter-terminal voltages V1-V9. Processing unit 23 obtains values of inter-terminal voltages V1-V9 from voltage detecting circuit 21.

Next, in step S22, processing unit 23 sets variable n to 1. Subsequently, in step S23, processing unit 23 determines whether or not variable n is equal to 3. When variable n is not 3 (NO in step S23), in step S24, processing unit 23 determines an absolute value $|\Delta Vn|(=|Vn-Vn+1|)$ of the difference between inter-terminal voltages Vn, Vn+1 of battery blocks Bn, Bn+1 (first and second battery blocks), respectively.

That is, in step S24, processing unit 23 selects, out of inter-terminal voltages V1-V9, inter-terminal voltages Vn, Vn+1 (first and second inter-terminal voltages) corresponding to battery blocks Bn, Bn+1 (first and second battery modules) being the same in the number of battery cells 15C among battery blocks B1-B9. Then, processing unit 23 obtains the difference between the first and second inter-terminal voltages. Here, the reason why two adjacent battery blocks are selected out of the battery blocks being the same in the number of battery cells is because the reduced difference in the temperature between the battery blocks prevents the two inter-terminal voltages from becoming different from each other due to the temperature difference.

In step S23, when variable n is equal to 3 (YES in step S23), processing unit sets $|\Delta V3|(=|V3-V4|)$ to 0. Since the number of battery cells are originally different between battery blocks B3 and B4, the inter-terminal voltages are different. Accordingly, $|\Delta V3|=0$ is set so that processing unit 23 does not erroneously determine that battery 15 is abnormal based on the value of $|\Delta V3|$.

When the process of step S24 or step S25 ends, in step S26, processing unit 23 determines whether or not absolute value $|\Delta Vn|$ is greater than 1.2 (V).

In step S26, when $|\Delta Vn| \leq 1.2(V)$ (NO in step S26), in step S27, processing unit 23 determines that $\Delta Vn$ is normal. On the other hand, when $|\Delta Vn| > 1.2(V)$ (YES in step S26), in step S28, processing unit 23 determines that $\Delta Vn$ is abnormal. That is, in the process of step S28, processing unit 23 determines that battery 15 is abnormal. It is to be noted that the value used in step S26 is not limited to 1.2V, and it can appropriately be set in accordance with the temperature or usage state and the like of the battery.

When the process of step S27 or step S28 ends, in step S29, processing unit 23 adds 1 to variable n. Next, in step S30, processing unit 23 determines whether or not variable n is equal to 9. When variable n is not 9 (NO in step S30), processing unit 23 again performs the process of step S23. On the other hand, when variable n is equal to 9 (YES in step S30), the whole processing ends.

As above, according to the second embodiment, by comparing the inter-terminal voltages of two battery blocks being the same in the number of battery cells, a plurality of assembled batteries being different in the number of battery cells constituting each battery block can appropriately be monitored.

Additionally, according to the second embodiment, when adjacent battery blocks are different in the number of battery cells constituting each battery block (that is, being different in the inter-terminal voltage even in a normal state), by setting the variable indicative of the difference in the inter-terminal voltage between the two battery blocks to 0 and performing the determination processing, an erroneous detection can be prevented.

Third Embodiment

A monitoring apparatus for a secondary battery according to a third embodiment is similarly configured as the one shown in FIG. 4. Accordingly, the configuration of the monitoring apparatus for the secondary battery according to the third embodiment is not repeatedly described.

Similarly to the second embodiment, in the third embodiment, using the inter-terminal voltages of two battery blocks being the same in the number of battery cells, abnormality of the secondary battery is determined. In the following, processing of the monitoring apparatus for the secondary battery according to the third embodiment is described with reference to "internal resistance abnormality of a battery cell" as another example of the abnormality of the secondary battery.

Figure 8:
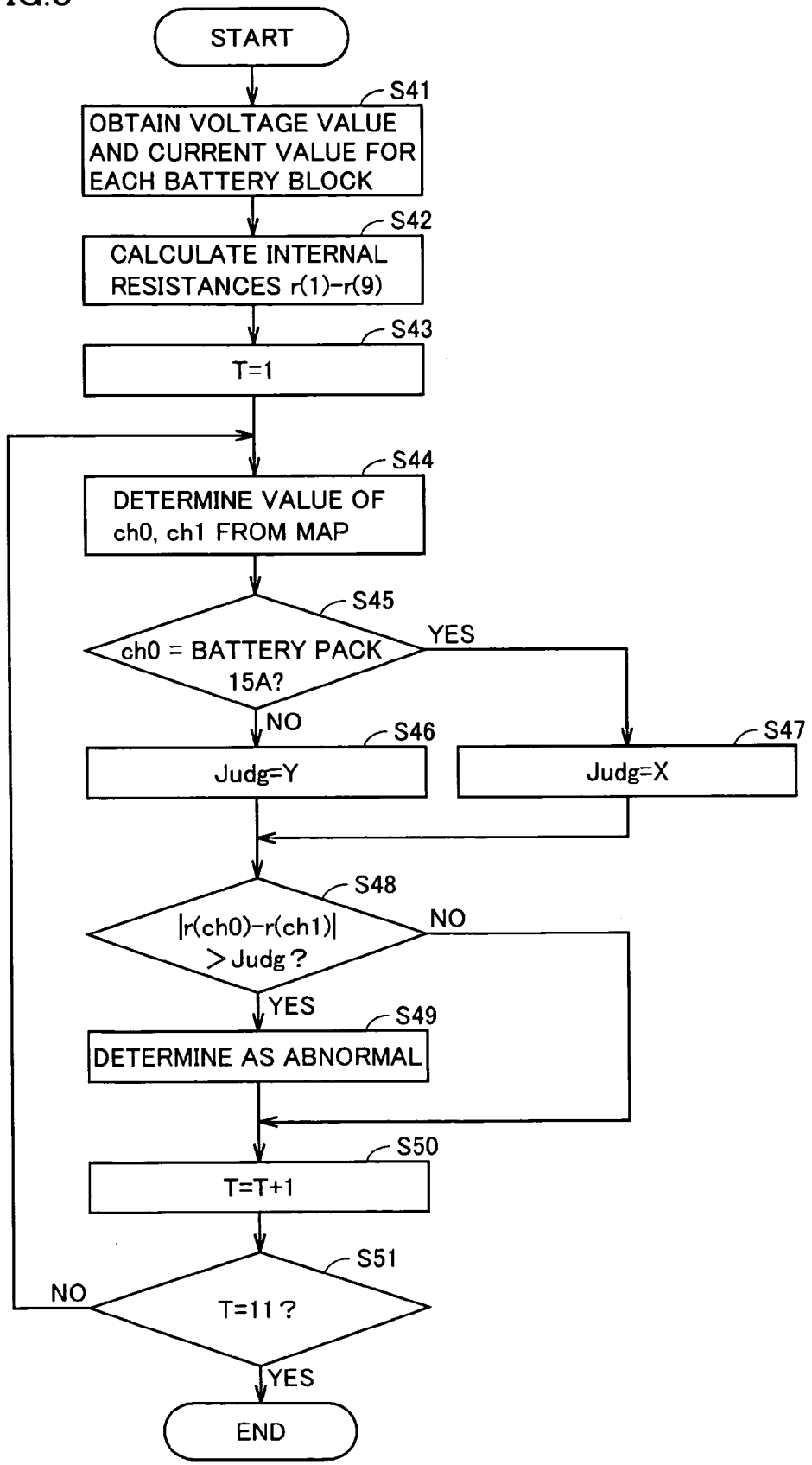
FIG. 8 is a flowchart describing abnormality detection processing by a monitoring apparatus for a secondary battery according to a third embodiment.

FIG. 8 is a flowchart describing abnormality detection processing by the monitoring apparatus for the secondary battery according to the third embodiment.

Referring to FIG. 8, when the processing is started, firstly in step S41, voltage detecting circuit 21 detects inter-terminal voltages V1-V9 and current detecting circuit 22 detects current of battery 15 when battery 15 is charged and discharged. The detection of voltage and current is performed for a plurality of times in each of charging mode and discharging mode of battery 15. Processing unit 23 obtains a result of detection from voltage detecting circuit 21 and current detecting circuit 22.

Next, in step S42, processing unit 23 calculates internal resistance r of a battery cell included in a battery block. In step S42, internal resistances r(1)-r(9) of battery cells included in battery blocks B1-B9, respectively, are calculated.

Figures 9, 10:
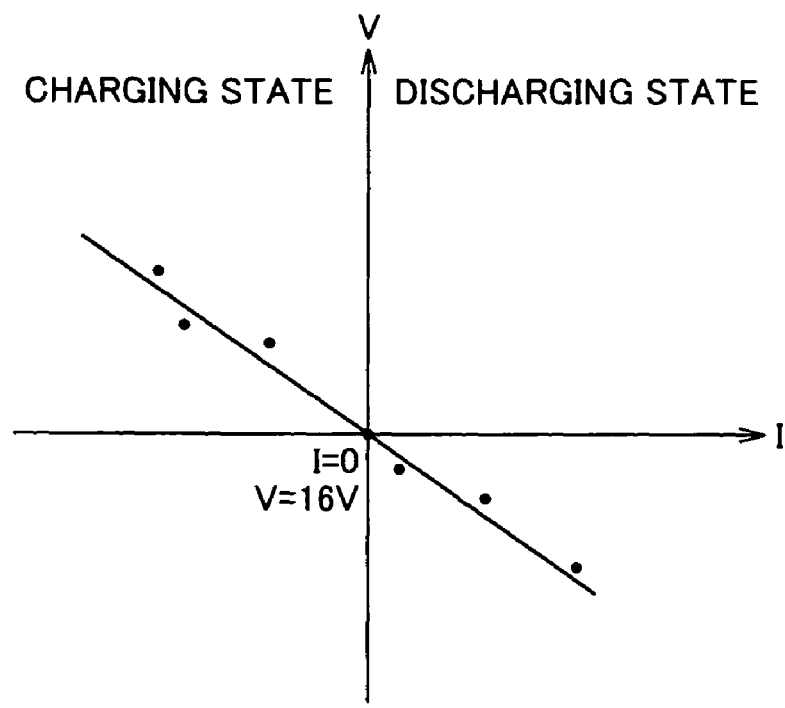
FIG. 9 shows an example of voltage and current detection result in any one of battery blocks B1-B9.
FIG. 10 shows an example of a map used in the process in step S44 in FIG. 8.

FIG. 9 shows an example of voltage and current detection result in any one of battery blocks B1-B9.

Referring to FIG. 9, by detecting voltage and current for a plurality of times, the inter-terminal voltage and current can be approximated according to a certain linear function. Accordingly, from the proportionality coefficient of the function, the internal resistance of the cells can be obtained. It is to be noted that, in the graph of FIG. 9, the reference of the voltage is a certain voltage (for example, 16V) and the reference of current is 0. The current value is negative in a charging state, and positive in a discharging state.

Description is given referring again to FIG. 8. In step S43, processing unit 23 sets the value of variable T to 1. In step S44, processing unit 23 refers to a map.

FIG. 10 shows an example of a map used in the process in step S44 in FIG. 8.

Referring to FIG. 10, values of variables ch0, ch1 are set in advance corresponding to variable T. Value n of variables ch0, ch1 is a value indicative of any one battery block Bn of battery blocks B1-B9. Processing unit 23 obtains the values of variables ch0, ch1 corresponding to variable T by referring to the map.

Description is given referring again to FIG. 8. In step S45, processing unit 23 determines whether or not ch0 is a value corresponding to any one of battery blocks B1-B3 of battery pack 15A. When $1 \leq ch0 \leq 3$ (YES in step S45), in step S47, processing unit 23 sets a determination value Judg to X. On the other hand, when $4 \leq ch0 \leq 9$ (NO in step S45), in step S46, processing unit 23 sets determination value Judg to Y.

The values of X and Y are determined as follows, for example. Firstly, the internal resistance of a battery cell in a normal state is A. The internal resistance in an abnormal state is a value five times greater than the internal resistance in a normal state (=5A).

Battery blocks B1-B3 are each configured with sixteen battery cells. Accordingly, the internal resistance of a battery cell is (A+15A)/16 in a normal state, and it is (5A+15A)/16 in an abnormal state. Therefore, in the following, the value of X is set as in the following expression (1):

$$X=(5A+15A)/16-(A+15A)/16=4A/16 \quad (1)$$

Battery blocks B4-B9 are each configured with twelve battery cells. Accordingly, the value Y is obtained similarly to X, as in the following expression (2):

$$Y=(5A+11A)/12-(A+11A)/12=4A/12 \quad (2)$$

Subsequently, in step S48, processing unit 23 uses values ch0, ch1 obtained from the map to obtain an absolute value $|\Delta r|(=|r(ch0)-r(ch1)|)$ of the difference between internal resistances r(ch0) and r(ch1). Internal resistances r(ch0) and r(ch1) are resistances of the battery cells respectively owned by two adjacent battery blocks. In step S48, processing unit 23 determines whether or not the value of $|\Delta r|$ is greater than determination value Judg.

When the value of $|\Delta r|$ is greater than determination value Judg (YES in step S48), in step S49, processing unit 23 determines that battery 15 is abnormal. When the process of step S49 ends, or when the value of |Δr| is not greater than determination value Judg (NO in step S48), in step S50, processing unit 23 adds 1 to variable T. In step S51, processing unit 23 determines whether or not variable T is equal to 11. When variable T is not 11 (NO is step S51), the processing returns to step S44. When variable T is equal to 11 (YES in step S51), the whole processing ends.

As above, according to the third embodiment, by comparing the internal resistances of the battery cells obtained from the inter-terminal voltages of two battery blocks being the same in the number of battery cells, abnormality of the secondary battery formed by a plurality of battery packs can be detected. Hence, according to the third embodiment, a plurality of assembled batteries being different in the number of battery cells constituting each battery block can appropriately be monitored.

It is to be noted that, in the second and third embodiment also, calculation of the SOC or calculation of allowable battery output may be performed as in the first embodiment.

While it has been described that the voltage is measured per battery block, the voltage may be measured for each module shown in FIG. 3, for example.

It should be understood that the embodiments disclosed herein are illustrative and non-restrictive in every respect. The scope of the present invention is defined by the terms of the claims, rather than the description, and is intended to include any changes within the meaning and scope equivalent to the terms of the claims.

The invention claimed is:

1. A monitoring apparatus for a secondary battery including a plurality of assembled batteries, wherein
    each of said plurality of assembled batteries has a plurality of battery blocks, and
    in at least one of said plurality of assembled batteries, a number of battery cells constituting each of said plurality of battery blocks is different from a reference number of cells of another of said plurality of assembled batteries, said monitoring apparatus comprising:
    a voltage detecting circuit detecting an inter-terminal voltage for each of said plurality of battery blocks; and
    a processing unit calculating a state of charge for each of said plurality of battery blocks, based on said inter-terminal voltage, wherein
    said processing unit converts said inter-terminal voltage into a voltage per said reference number of cells for a battery block having the number of said battery cells different than said reference number of cells among said plurality of battery blocks, and obtains said state of charge.

2. The monitoring apparatus for the secondary battery according to claim 1, wherein
    said monitoring apparatus is shared by said plurality of assembled batteries.

3. The monitoring apparatus for the secondary battery according to claim 1, wherein
    said voltage detecting circuit detects said inter-terminal voltage for each of said plurality of battery blocks over said plurality of assembled batteries.

4. The monitoring apparatus for the secondary battery according to claim 3, wherein
    said monitoring apparatus is shared by said plurality of assembled batteries.

5. A monitoring apparatus for a secondary battery including a plurality of assembled batteries, wherein
    each of said plurality of assembled batteries has a plurality of battery blocks, and
    in at least one of said plurality of assembled batteries, a number of battery cells constituting each of said plurality of battery blocks is different from a reference number of cells of another of said plurality of assembled batteries, said monitoring apparatus comprising:
    a voltage detecting circuit detecting a plurality of inter-terminal voltages respectively corresponding to said plurality of battery blocks; and
    a processing unit performing an abnormality determination of said secondary battery using said plurality of inter-terminal voltages detected by said voltage detecting circuit, wherein
    said processing unit selects, out of said plurality of inter-terminal voltages, first and second inter-terminal voltages respectively corresponding to, among said plurality of battery blocks, first and second battery blocks being identical in number of said battery cells, and determines abnormality of said secondary battery by using said first and second inter-terminal voltages.

6. The monitoring apparatus for the secondary battery according to claim 5, wherein
    said monitoring apparatus is shared by said plurality of assembled batteries.

7. The monitoring apparatus for the secondary battery according to claim 5, wherein
    said voltage detecting circuit detects said inter-terminal voltage for each of said plurality of battery blocks over said plurality of assembled batteries.

8. The monitoring apparatus for the secondary battery according to claim 7, wherein
    said monitoring apparatus is shared by said plurality of assembled batteries.

* * * * *